(12) United States Patent
Myllyla et al.

(10) Patent No.: US 9,294,060 B2
(45) Date of Patent: Mar. 22, 2016

(54) BANDWIDTH EXTENDER

(75) Inventors: Ville Mikael Myllyla, Tampere (FI);
Laura Laaksonen, Espoo (FI); Hannu Juhani Pulakka, Espoo (FI); Paavo Ilmari Alku, Helsinki (FI)

(73) Assignee: Nokia Technologies Oy, Espoo (FI)

( * ) Notice: Subject to any disclaimer, the term of this patent is extended or adjusted under 35 U.S.C. 154(b) by 557 days.

(21) Appl. No.: 13/700,093

(22) PCT Filed: May 25, 2010

(86) PCT No.: PCT/IB2010/052315
§ 371 (c)(1),
(2), (4) Date: Feb. 6, 2013

(87) PCT Pub. No.: WO2011/148230
PCT Pub. Date: Dec. 1, 2011

(65) Prior Publication Data
US 2013/0144614 A1 Jun. 6, 2013

(51) Int. Cl.
*G10L 21/00* (2013.01)
*H03G 3/20* (2006.01)
*G10L 19/02* (2013.01)
*G10L 21/038* (2013.01)
*G10L 25/78* (2013.01)
*G10L 19/26* (2013.01)

(52) U.S. Cl.
CPC .............. *H03G 3/20* (2013.01); *G10L 19/0208* (2013.01); *G10L 21/038* (2013.01); *G10L 25/78* (2013.01); *G10L 19/26* (2013.01)

(58) Field of Classification Search
CPC .................................................. G10L 21/038
See application file for complete search history.

(56) References Cited

U.S. PATENT DOCUMENTS

| 5,455,888 | A | 10/1995 | Iyengar et al. |
| 6,539,355 | B1 | 3/2003 | Nishiguchi et al. |
| 8,527,283 | B2 * | 9/2013 | Jasiuk et al. .................. 704/500 |

(Continued)

FOREIGN PATENT DOCUMENTS

| EP | 0 732 687 A2 | 9/1996 |
| EP | 1 420 389 A1 | 5/2004 |
| WO | WO 2008/060068 A1 | 5/2008 |

OTHER PUBLICATIONS

Iser, Bernd, Gerhard Schmidt, and Wolfgang Minker. Bandwidth extension of speech signals. vol. 13. Springer Science & Business Media, 2008.*

(Continued)

*Primary Examiner* — Brian Albertalli
(74) *Attorney, Agent, or Firm* — Alston & Bird LLP

(57) ABSTRACT

An apparatus for extending the bandwidth of an audio signal, the apparatus being configured to: generate an excitation signal from an audio signal, wherein in the audio signal comprises a plurality of frequency components; extract a feature vector from the audio signal, wherein the feature vector comprises at least one frequency domain component feature and at least one time domain component feature; determine at least one spectral shape parameter from the feature vector, wherein the at least one spectral shape parameter corresponds to a sub band signal comprising frequency components which belong to a further plurality of frequency components; and generate the sub band signal by filtering the excitation signal through a filter bank and weighting the filtered excitation signal with the at least one spectral shape parameter.

18 Claims, 6 Drawing Sheets

(56) References Cited

U.S. PATENT DOCUMENTS

| | | | |
|---|---|---|---|
| 2002/0138268 A1* | 9/2002 | Gustafsson | 704/258 |
| 2003/0050786 A1* | 3/2003 | Jax et al. | 704/500 |
| 2003/0093279 A1* | 5/2003 | Malah et al. | 704/265 |
| 2005/0267739 A1 | 12/2005 | Kontio et al. | |
| 2005/0267741 A1* | 12/2005 | Laaksonen et al. | 704/209 |
| 2008/0208572 A1* | 8/2008 | Nongpiur et al. | 704/205 |
| 2009/0198498 A1* | 8/2009 | Ramabadran et al. | 704/500 |
| 2011/0099004 A1* | 4/2011 | Krishnan et al. | 704/206 |
| 2013/0024191 A1* | 1/2013 | Krutsch et al. | 704/205 |

OTHER PUBLICATIONS

Uncini, Aurelio, Francesco Gobbi, and Francesco Piazza. "Frequency recovery of narrow-band speech using adaptive spline neural networks." Acoustics, Speech, and Signal Processing, 1999. Proceedings., 1999 IEEE International Conference on. vol. 2. IEEE, 1999.*

Kornagel, Ulrich. "Improved artificial low-pass extension of telephone speech." International Workshop on Acoustic Echo and Noise Control (IWAENC2003), Kyoto, Japan. 2003.*

Kornagel, Ulrich. "Techniques for artificial bandwidth extension of telephone speech." Signal Processing 86.6 (2006): 1296-1306.*

Office Action for European Application No. EP 10 85 2073 dated Aug. 7, 2014.

Laaksonen, L. et al., *Artificial Bandwidth Expansion Method to Improve Intellligibility and Quality of AMR-Coded Narrowband Speech*, ISASSP (2005) pp. I-809-I-812.

International Preliminary Report on Patentability/Written Opinion for Application No. PCT/IB2010/052315 dated Nov. 27, 2012.

International Search Report for Application No. PCT/IB2010/052315 dated Feb. 16, 2011.

Digital Cellular Telecommunications System (Phase 2+); University Mobile Telecommunications System (UMTS); Audio Codec Processing Functions; Extended Adaptive Multi-Rate—Wideband (AMR-WB+) Codec; Transcoding Functions (3GPP TS 26.290 version 7.0.0 Release 7); ETSI TS 126 290, ETSI Standards, LIS, Sophia Antipolis Cedex, France, Mar. 1, 2007.

Digital Cellular Telecommunications System (Phase 2+); Universal Mobile Telecommunicatons System (UMTS); LTE; Mandatory Speech Codec Speech Processing Functions; Adaptive Multi-Rate (AMR) Speech Codec; Transcoding Functions (3GPP TS 26.090 version 9.0.0 Release 9) dated Jan. 2010.

* cited by examiner

BANDWIDTH EXTENDER

FIELD OF THE INVENTION

The present invention relates to an apparatus and method for improving the quality of an audio signal. In particular, the present invention relates to an apparatus and method for extending the bandwidth of an audio signal.

BACKGROUND OF THE INVENTION

Audio signals, such as speech or music, may be encoded for enabling an efficient transmission or storage of the audio signals.

Audio signals may be limited to a bandwidth which is typically determined by the available capacity of the transmission system or storage medium. However, in some instances it may be desirable to perceive the decoded audio signal at a higher bandwidth than the bandwidth at which the audio signal was originally encoded. In these instances artificial bandwidth extension may be deployed at the decoder, whereby the bandwidth of the decoded audio signal may be extended by using information solely determined from the decoded audio signal itself.

One such example of the application of artificial bandwidth extension may lie in the area of mobile telecommunications. Typically in a mobile communication system such as the Global System for Mobile Communications (GSM), the speech signal may be limited to a bandwidth of less than 4 kHz, in other words a narrow band speech signal. However, naturally occurring speech may contain significant frequency components up to 10 kHz. The additional higher frequencies may contribute to the overall quality and intelligibility of the speech signal resulting crisper and brighter sound when compared to the equivalent narrowband signal.

Existing methods for improving the quality and intelligibility of narrowband speech by artificial bandwidth extension may deploy a codebook to generate the additional high frequency components. The codebook may comprise frequency vectors of different spectral characteristics, all of which cover the range of frequencies of interest. The frequency range may be extended, on a frame by frame basis, by selecting the optimal vector and adding to it spectral components from the received decoded signal.

Additionally artificial bandwidth extension methods may deploy the technique of up sampling in order to create alias copies of the received signal at the higher frequency components. The magnitude or energy levels of the aliased frequency components may then be adjusted in order to create the representative higher frequencies of the speech signal.

However, existing methods of artificial bandwidth extension can suffer from poor quality and inefficiency.

For example, some methods of artificial bandwidth extension can adopt a system classifying the incoming speech frames by their phonetic content in order to determine an upper band envelope. The envelope can then be used to shape the frequency spectrum created by the aliasing of the lower frequencies.

However, upper bands which are generated using this approach can not always sound natural. This may partly be attributed to the fact that transitions between different phonemes are naturally smooth in a speech signal. Whereas using a system of classifying the phonemes may have the consequence of introducing discontinuities at decision boundaries.

Other factors can also contribute to an unnatural sound using the above artificial bandwidth extension approach, such as incorrect classification of the incoming speech frames and inaccurate estimation of the high band spectral shape.

SUMMARY OF SOME EMBODIMENTS

This invention proceeds from the consideration that existing artificial bandwidth extension schemes may result in a degradation to the overall perceived naturalness of the extended audio signal. This degradation may be especially prevalent for the overall perception of sibilant sounds.

Embodiments aim to address the above problem.

There is provided according to a first aspect of some embodiments a method comprising: generating an excitation signal from an audio signal, wherein in the audio signal comprises a plurality of frequency components; extracting a feature vector from the audio signal, wherein the feature vector comprises at least one frequency domain component feature and at least one time domain component feature; determining at least one spectral shape parameter from the feature vector, wherein the at least one spectral shape parameter corresponds to a sub band signal comprising frequency components which belong to a further plurality of frequency components; and generating the sub band signal by filtering the excitation signal through a filter bank and weighting the filtered excitation signal with the at least one spectral shape parameter.

According to an embodiment the method may when generating the excitation signal comprise generating a residual signal by filtering the audio signal with an inverse linear predictive filter; filtering the residual signal with a post filter stage comprising an auto regressive moving average filter based on the linear predictive filter; and generating the excitation signal by up sampling and spectrally folding the output from the post filter stage.

The post filter stage may further comprise a spectral tilt filter and a harmonic filter.

The frequency components of the sub band signal may be distributed according to a psychoacoustic scale comprising a plurality of overlapping bands, and the frequency characteristics of the filter bank may correspond to the distribution of frequency components of the sub band signal.

The overlapping bands may be distributed according to the mel scale, and wherein the sub band signal may be masked using a triangular masking function.

Alternatively the overlapping bands may be distributed according to the mel scale, and wherein the sub band signal may be masked using a trapezoidal masking function.

Determining at least one spectral shape parameter from the feature vector may comprises: using a neural network to determine the at least one spectral shape from the feature vector, wherein the feature vector extracted from the audio signal may form an input target vector to the neural network, and wherein the neural network may be trained to provide a sub band spectral shape parameter for the input target vector.

The spectral shape parameter may be a sub band energy level value.

The spectral shape parameter may be a sub band gain factor based on the sub band energy level value.

The sub band energy level value may be attenuated when the power of the audio signal approaches an estimate of the level of noise in the audio signal.

The at least one frequency domain component feature of the feature vector may comprise at least one of the following: a group of a plurality of energy levels of the audio signal, wherein each of the plurality energy levels corresponds to the energy of an overlapping band of the audio signal; a value representing a centroid of the frequency domain spectrum of the audio signal; and a value representing the degree of flatness of the frequency domain spectrum.

The at least one time domain component feature of the feature vector may comprise at least one of the following a gradient index based on the sum of the gradient at points in the audio signal which result in a change in direction of the waveform of the audio signal; a ratio of the energy of a frame of the audio signal to the energy of a previous frame of the audio signal; and a voice activity detector indicating whether a frame of the audio signal is classified as active or inactive.

The method may further comprise combining the sub band signal with the audio signal to provide a bandwidth extended audio signal.

According to a second aspect of some embodiments there is provided an apparatus comprising at least one processor and at least one memory including computer code, the at least one memory and the computer code configured to with the at least one processor cause the apparatus to at least perform: generating an excitation signal from an audio signal, wherein in the audio signal comprises a plurality of frequency components; extracting a feature vector from the audio signal, wherein the feature vector comprises at least one frequency domain component feature and at least one time domain component feature; determining at least one spectral shape parameter from the feature vector, wherein the at least one spectral shape parameter corresponds to a sub band signal comprising frequency components which belong to a further plurality of frequency components; and generating the sub band signal by filtering the excitation signal through a filter bank and weighting the filtered excitation signal with the at least one spectral shape parameter.

According to an embodiment the apparatus when the at least one memory and the computer code is configured to with the at least one processor to cause the apparatus to at least perform generating the excitation signal the apparatus may be further configured to perform; generating a residual signal by filtering the audio signal with an inverse linear predictive filter; filtering the residual signal with a post filter stage comprising an auto regressive moving average filter based on the linear predictive filter; and generating the excitation signal by up sampling and spectrally folding the output from the post filter stage.

The post filter stage may further comprise a spectral tilt filter and a harmonic filter.

The frequency components of the sub band signal may be distributed according to a psychoacoustic scale comprising a plurality of overlapping bands, and the frequency characteristics of the filter bank may correspond to the distribution of frequency components of the sub band signal.

The overlapping bands may be distributed according to the mel scale wherein the sub band signal may be masked using a triangular masking function.

Alternatively the overlapping bands may be distributed according to the mel scale, wherein the sub band signal may be masked using a trapezoidal masking function.

The at least one memory and the computer code configured to with the at least one processor to cause the apparatus to at least perform determining at least one spectral shape parameter from the feature vector may be further configured to perform: using a neural network to determine the at least one spectral shape from the feature vector, wherein the feature vector extracted from the audio signal forms an input target vector to the neural network, and wherein the neural network is trained to provide a sub band spectral shape parameter for the input target vector.

The spectral shape parameter may be a sub band energy level value.

The spectral shape parameter may be a sub band gain factor based on the sub band energy level value.

The sub band energy level value may be attenuated when the power of the audio signal approaches an estimate of the level of noise in the audio signal.

The at least one frequency domain component feature of the feature vector may comprise at least one of the following: a group of a plurality of energy levels of the audio signal, wherein each of the plurality energy levels corresponds to the energy of an overlapping band of the audio signal; a value representing a centroid of the frequency domain spectrum of the audio signal; and a value representing the degree of flatness of the frequency domain spectrum.

The at least one time domain component feature of the feature vector may comprise at least one of the following: a gradient index based on the sum of the gradient at points in the audio signal which result in a change in direction of the waveform of the audio signal; a ratio of the energy of a frame of the audio signal to the energy of a previous frame of the audio signal; and a voice activity detector indicating whether a frame of the audio signal is classified as active or inactive.

The at least one memory and the computer code is further configured to perform combining the sub band signal with the audio signal to provide a bandwidth extended audio signal.

There is according to a third aspect of some embodiments a computer program product in which software code is stored in a computer readable medium, wherein said code realizes the following when being executed by a processor: generating an excitation signal from an audio signal, wherein in the audio signal comprises a plurality of frequency components; extracting a feature vector from the audio signal, wherein the feature vector comprises at least one frequency domain component feature and at least one time domain component feature; determining at least one spectral shape parameter from the feature vector, wherein the at least one spectral shape parameter corresponds to a sub band signal comprising frequency components which belong to a further plurality of frequency components; and generating the sub band signal by filtering the excitation signal through a filter bank and weighting the filtered excitation signal with the at least one spectral shape parameter.

According to an embodiment the computer program product when the code realizes generating the excitation signal when being executed by a processor the code may further realize: generating a residual signal by filtering the audio signal with an inverse linear predictive filter; filtering the residual signal with a post filter stage comprising an auto regressive moving average filter based on the linear predictive filter; and generating the excitation signal by up sampling and spectrally folding the output from the post filter stage.

The post filter stage further may comprise a spectral tilt filter and a harmonic filter.

The frequency components of the sub band signal may be distributed according to a psychoacoustic scale comprising a plurality of overlapping bands, and the frequency characteristics of the filter bank may correspond to the distribution of frequency components of the sub band signal.

The overlapping bands may be distributed according to the mel scale, and wherein the sub band signal may be masked using a triangular masking function.

Alternatively, the overlapping bands may be distributed according to the mel scale, and wherein the sub band signal may be masked using a trapezoidal masking function.

The code realizing determining at least one spectral shape parameter from the feature vector when being executed by a processor may further realize: using a neural network to determine the at least one spectral shape from the feature vector, wherein the feature vector extracted from the audio signal may form an input target vector to the neural network, and wherein the neural network may be trained to provide a sub band spectral shape parameter for the input target vector.

The spectral shape parameter may be a sub band energy level value.

The spectral shape parameter may be a sub band gain factor based on the sub band energy level value.

The sub band energy level value may be attenuated when the power of the audio signal approaches an estimate of the level of noise in the audio signal.

The at least one frequency domain component feature of the feature vector may comprise at least one of the following: a group of a plurality of energy levels of the audio signal, wherein each of the plurality energy levels corresponds to the energy of an overlapping band of the audio signal; a value representing a centroid of the frequency domain spectrum of the audio signal; and a value representing the degree of flatness of the frequency domain spectrum.

The at least one time domain component feature of the feature vector may comprise at least one of the following: a gradient index based on the sum of the gradient at points in the audio signal which result in a change in direction of the waveform of the audio signal; a ratio of the energy of a frame of the audio signal to the energy of a previous frame of the audio signal; and a voice activity detector indicating whether a frame of the audio signal is classified as active or inactive.

The code may further realize combining the sub band signal with the audio signal to provide a bandwidth extended audio signal.

There is according to a fourth aspect of some embodiments an apparatus comprising: an excitation signal generator configured to generate an excitation signal from an audio signal, wherein in the audio signal comprises a plurality of frequency components; a feature extractor configured to extract a feature vector from the audio signal, wherein the feature vector comprises at least one frequency domain component feature and at least one time domain component feature; a spectral parameter determiner configured to determine at least one spectral shape parameter from the feature vector, wherein the at least one spectral shape parameter corresponds to a sub band signal comprising frequency components which belong to a further plurality of frequency components; and a filter bank configured to generate the sub band signal by filtering the excitation signal and weighting the filtered excitation signal with the at least one spectral shape parameter.

The excitation signal generator may comprise: an inverse linear predictive filter configured to generate a residual signal by filtering the audio signal; a post filter stage comprising an auto regressive moving average filter configured to filter the residual signal, wherein the auto regressive moving average filter is dependent on the linear predictive filter; and an upsampler configured to generate the excitation signal by up sampling and spectrally folding the output from the post filter stage.

The post filter stage may further comprise: a spectral tilt filter; and a harmonic filter.

The frequency components of the sub band signal may be distributed according to a psychoacoustic scale comprising a plurality of overlapping bands, and the frequency characteristics of the filter bank correspond to the distribution of frequency components of the sub band signal.

The overlapping bands may be distributed according to the mel scale, and wherein the sub band signal may be masked using at least one of a triangular masking function; and a trapezoidal masking function.

The spectral parameter determiner may comprise: a neural network configured to determine the at least one spectral shape from the feature vector, wherein the feature vector extracted from the audio signal forms an input target vector to the neural network, and wherein the neural network is trained to provide a sub band spectral shape parameter for the input target vector.

The spectral shape parameter may be a sub band energy level value.

The spectral shape parameter may be a sub band gain factor based on the sub band energy level value.

The filter bank may comprise an attenuator configured to attenuate the sub band energy level value is attenuated when the power of the audio signal approaches an estimate of the level of noise in the audio signal.

The at least one frequency domain component feature of the feature vector may comprise at least one of: a group of a plurality of energy levels of the audio signal, wherein each of the plurality energy levels corresponds to the energy of an overlapping band of the audio signal; a value representing a centroid of the frequency domain spectrum of the audio signal; and a value representing the degree of flatness of the frequency domain spectrum.

The at least one time domain component feature of the feature vector may comprise at least one of the following: a gradient index based on the sum of the gradient at points in the audio signal which result in a change in direction of the waveform of the audio signal; a ratio of the energy of a frame of the audio signal to the energy of a previous frame of the audio signal; and a voice activity detector indicating whether a frame of the audio signal is classified as active or inactive.

The apparatus may further comprise a signal combiner configured to combine the sub band signal with the audio signal to provide a bandwidth extended audio signal.

An electronic device may comprise apparatus as described above.

A chipset may comprise apparatus as described above.

BRIEF DESCRIPTION OF DRAWINGS

For better understanding of the present invention, reference will now be made by way of example to the accompanying drawings in which.

SOME EMBODIMENTS OF THE INVENTION

Figure 1:
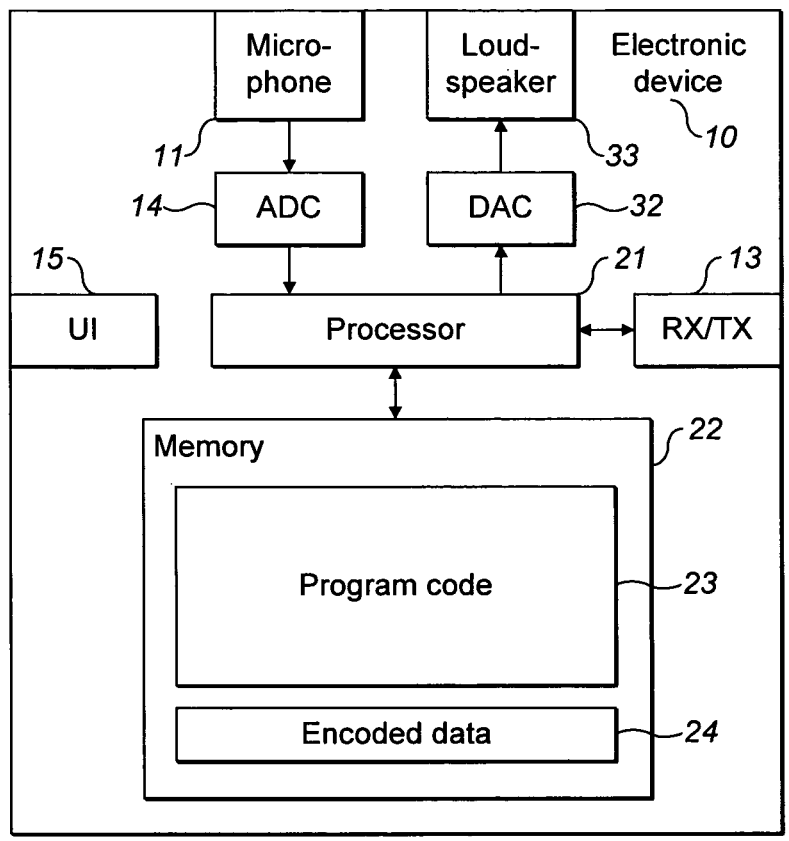
FIG. 1 shows schematically an electronic device employing embodiments of the invention.

The following describes in more detail possible mechanisms for the provision of artificially expanding the bandwidth of a decoded audio signal. In this regard reference is first made to FIG. 1 which shows a schematic block diagram of an exemplary electronic device 10 or apparatus, which may incorporate a codec according to an embodiment of the invention.

The electronic device or apparatus 10 may for example be a mobile terminal or user equipment of a wireless communication system. In some other embodiments the apparatus 10 can be any suitable audio or audio-subsystem component within an electronic device such as audio player (also known as MP3 players) or media players (also known as MP4 players).

The electronic device 10 comprises a microphone 11, which is linked via an analogue-to-digital converter (ADC) 14 to a processor 21. The processor 21 is further linked via a digital-to-analogue converter (DAC) 32 to loudspeaker(s) 33. The processor 21 is further linked to a transceiver (RX/TX) 13, to a user interface (UI) 15 and to a memory 22.

The processor 21 may be configured to execute various program codes. The implemented program codes 23 may comprise an audio decoding code or speech decoding code. The implemented program codes 23 may be stored for example in the memory 22 for retrieval by the processor 21 whenever needed. The memory 22 could further provide a section 24 for storing data, for example data that has been encoded in accordance with the invention.

The decoding code may in embodiments of the invention be implemented in electronic based hardware or firmware.

The user interface 15 enables a user to input commands to the electronic device 10, for example via a keypad, and/or to obtain information from the electronic device 110, for example via a display. The transceiver 13 enables a communication with other electronic devices, for example via a wireless communication network.

It is to be understood again that the structure of the electronic device 10 could be supplemented and varied in many ways.

A user of the electronic device 10 may use the microphone 11 for inputting speech that is to be transmitted to some other electronic device or that is to be stored in the data section 24 of the memory 22. A corresponding application has been activated to this end by the user via the user interface 15. This application, which may be run by the processor 21, causes the processor 21 to execute the encoding code stored in the memory 22.

The analogue-to-digital converter 14 converts the input analogue audio signal into a digital audio signal and provides the digital audio signal to the processor 21.

The electronic device 10 could receive a bit stream with correspondingly encoded data from another electronic device via its transceiver 13. Alternatively, coded data could be stored in the data section 24 of the memory 22, for instance for a later presentation by the same electronic device 10. In both cases, the processor 21 may execute the decoding program code stored in the memory 22. The processor 21 decodes the received data, for instance in the same way as described with reference to FIGS. 3 and 4, and provides the decoded data to the digital-to-analogue converter 32. The digital-to-analogue converter 32 converts the digital decoded data into analogue audio data and outputs them via the loudspeaker(s) 33. Execution of the decoding program code could be triggered as well by an application that has been called by the user via the user interface 15.

The received encoded data could also be stored instead of an immediate presentation via the loudspeaker(s) 33 in the data section 24 of the memory 22, for instance for enabling a later presentation or a forwarding to still another electronic device.

Figure 3:
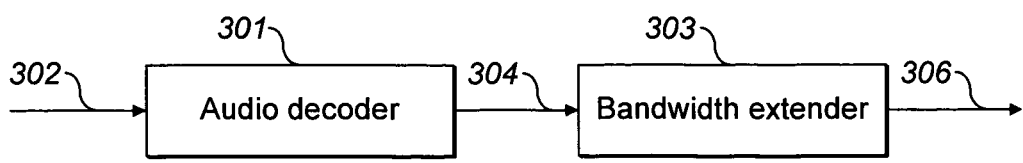
FIG. 3 shows schematically a decoder deploying a first embodiment of the invention.
Figure 4:
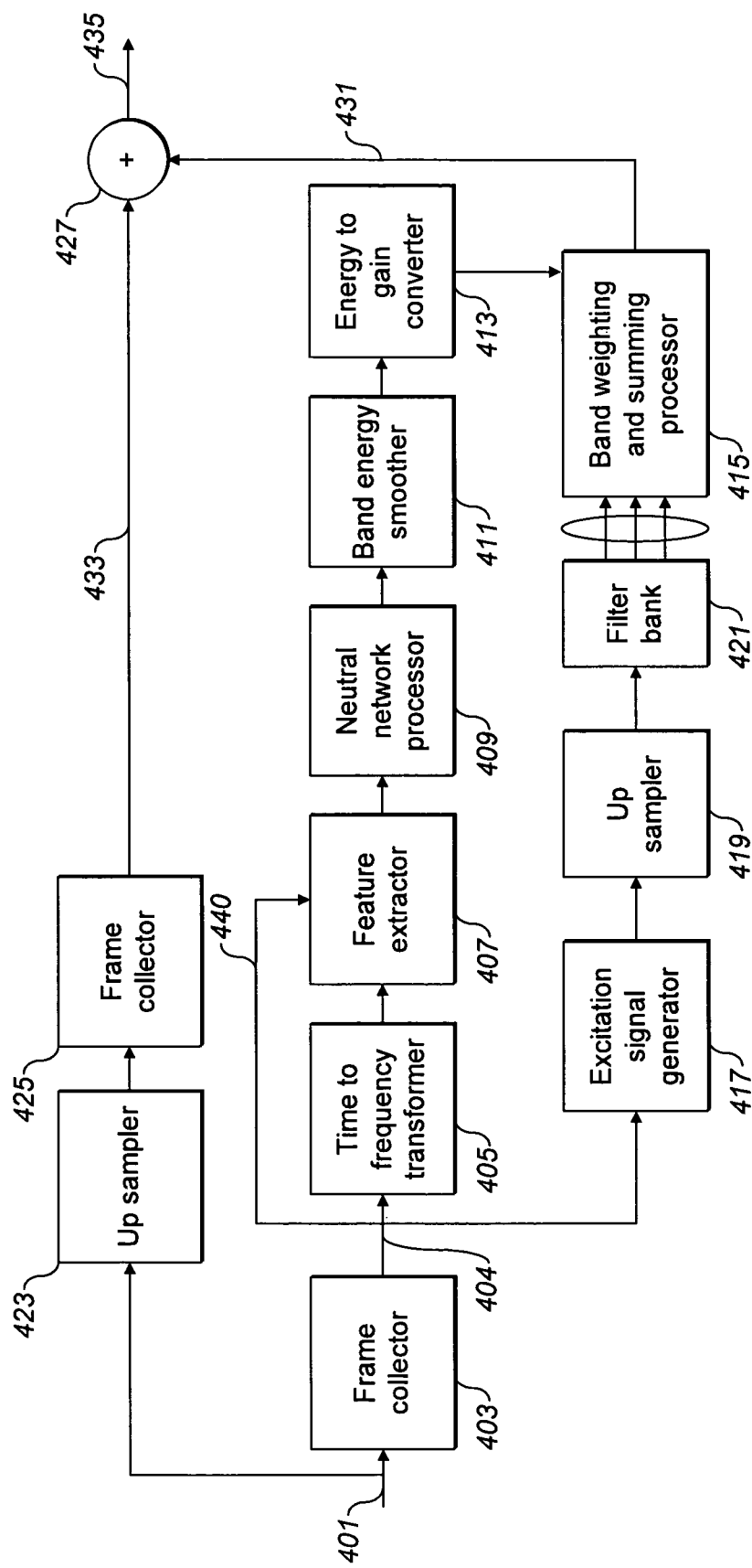
FIG. 4 shows schematically a bandwidth extender according to some embodiments of the invention.
Figure 8:
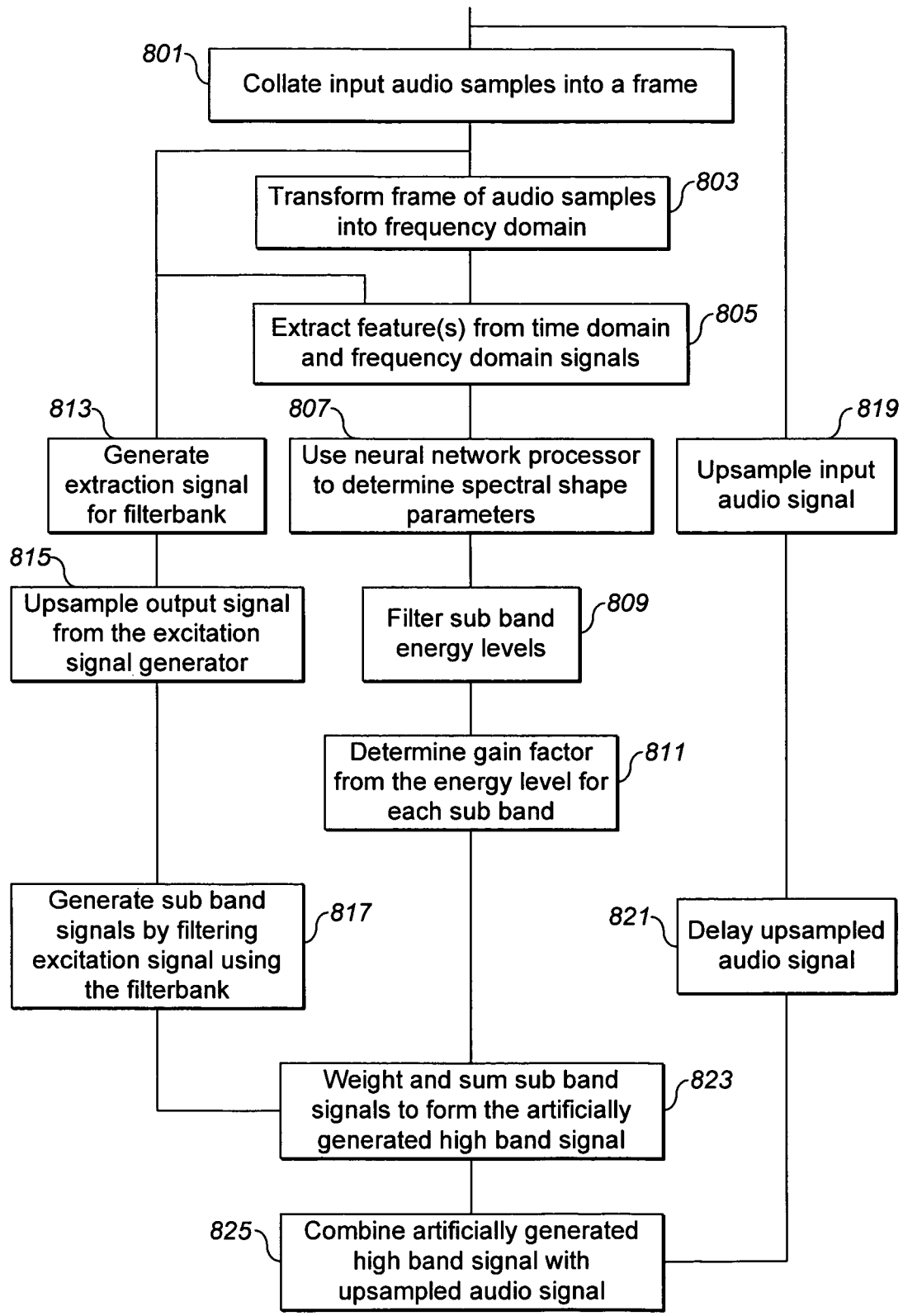
FIG. 8 shows a flow diagram illustrating the operation of the bandwidth extender according to some embodiments of the invention.
Figure 9:
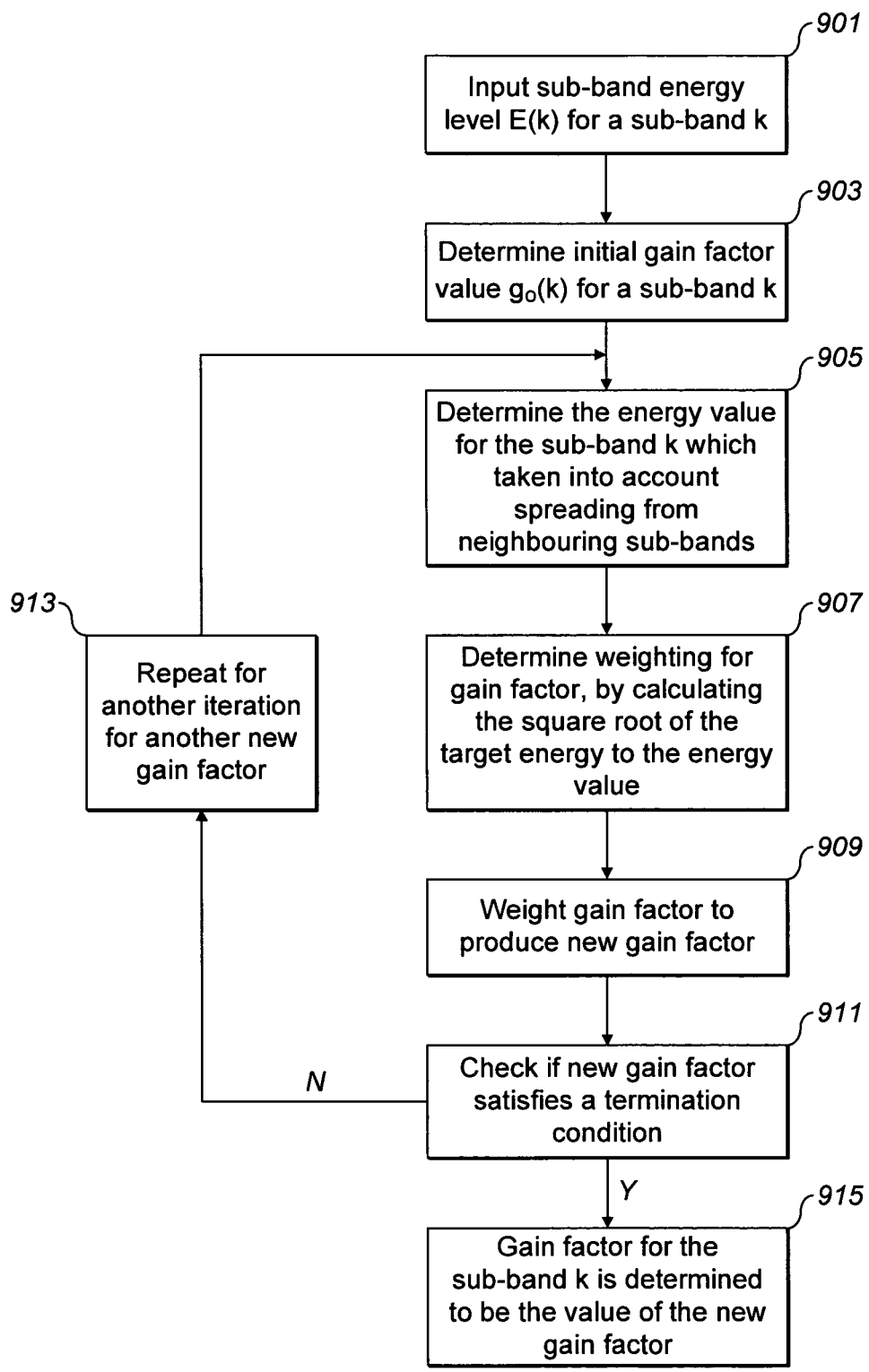
FIG. 9 shows a flow diagram illustrating in further detail a part of the operation of an embodiment of the bandwidth extender as shown in FIG. 4.
Figure 10:
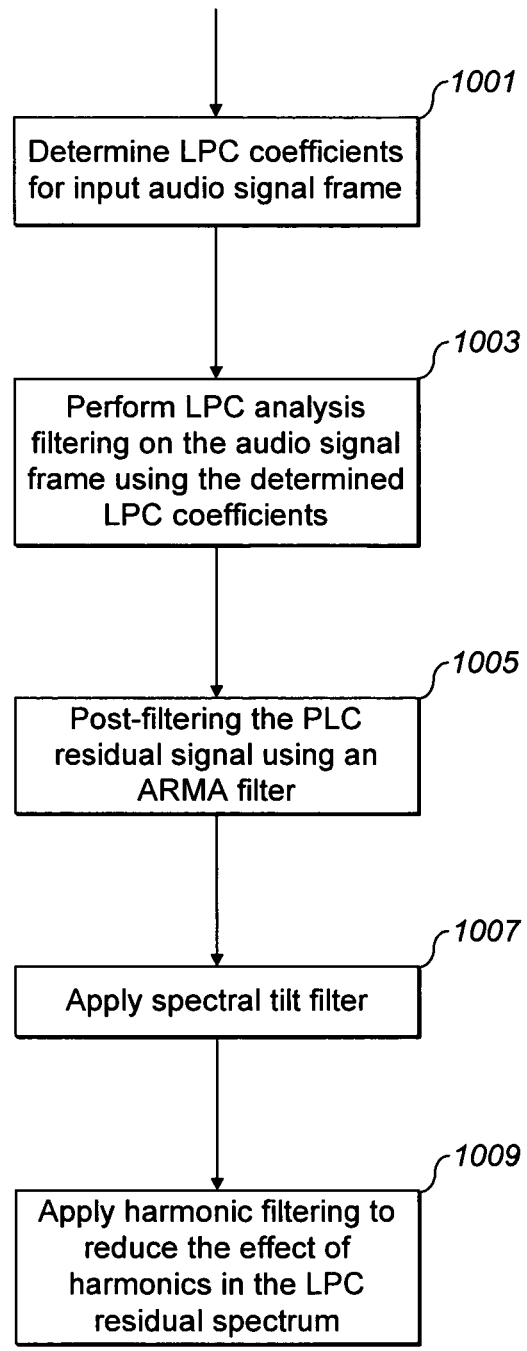
FIG. 10 shows a flow diagram illustrating in further detail a further part of the operation of an embodiment of the bandwidth extender as shown in FIG. 4.

It would be appreciated that the schematic structures described in FIGS. 3 and 4 and the method steps in FIGS. 8, 9 and 10 represent only a part of the operation of a complete bandwidth extender as exemplarily shown implemented in the electronic device shown in FIG. 1.

The general operation of speech and audio codecs are known from the art and features of such codecs which do not assist in the understanding of the operation of the embodiments of the invention are not described in detail.

Embodiments of the application are now described in more detail with respect to FIGS. 2 to 10.

Figure 2:
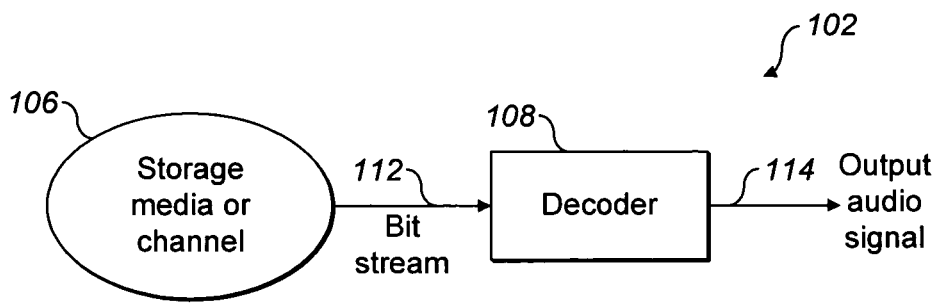
FIG. 2 shows schematically a decoder system employing embodiments of the invention.

The general operation of speech and audio decoders as employed by embodiments of the application is shown in FIG. 2. A general decoding system 102 is illustrated schematically in FIG. 2. The system 102 may comprise a storage or media channel (also known as a communication channel) 106 and a decoder 108.

The decoder 108 decompresses the bit stream 112 and produces an output audio signal 114. The bit rate of the bit stream 112 and the quality of the output audio signal 114 in relation to the input signal 110 are the main features, which define the performance of the coding system 102.

FIG. 3 shows schematically a decoder 108 according to some embodiments of the application. The decoder 108 comprises an input 302 from which the encoded stream 112 may be received via the media channel 106. The input 302 in some embodiments is connected to an audio decoder 301. The audio decoder 301 in such embodiments is configured to receive encoded data from a media or communication channel, whereby the received data can be stored and unpacked. The audio decoder 301 in such embodiments is further configured to decode the encoded data from the media channel 106 in order to produce an output sample based audio stream 304. The audio stream output from the audio decoder 301 can be connected to the input of an artificial bandwidth extender 303. The bandwidth extender 303 can in some embodiments be arranged to expand the bandwidth of the audio stream input 304 in order to produce an output bandwidth extended audio signal 306.

The bandwidth extended audio signal 306 can in some embodiments form the output audio signal 114 from the decoder 108.

It is to be understood in some embodiments that the audio decoder 301 may be specifically arranged to decode the input encoded data conveyed by the input 302. In other words, the audio decoding technology employed by the audio decoder 301 may be determined by the audio encoding technology used to produce the encoded data.

It is to be further understood in some embodiments that the audio decoder 301 can be arranged to decode either audio or speech encoded data.

For example, in some embodiments the audio decoder 301 can be configured to decode a speech signal which may have been encoded according to the Adaptive multirate (AMR) speech coding standard.

Details of the AMR codec can for example be found in the 3GPP TS 26.090 technical specification.

With reference to FIG. 4, there is depicted in further detail the audio bandwidth extender 303 according to some embodiments.

The artificial bandwidth extender 303 comprises an input 401 which can be configured to receive the audio sample stream output 304 from the audio decoder 301.

It is to be understood that the decoded audio sample stream entering the bandwidth extender 303 can be considered as a low band signal. The bandwidth extender 303 in some embodiments can then analyse the low band signal in order to identify particular features. The identified features in such embodiments can then be used to create a high band audio signal which can then be combined with the low band audio signal in order to produce a bandwidth extended audio signal 306.

It is to be further understood that the high band component of the bandwidth extended audio signal can in the embodiments be formed without the need of additional side information from the encoder.

In some embodiments the input low band signal may be determined to have a telephone bandwidth of 300 to 3400 Hz with a sampling frequency of 8 kHz. In these embodiments the bandwidth extender 303 can expand the input audio signal to a wideband audio signal with a sampling frequency of 16 kHz and a frequency range which may be wider than that of the input.

It is to be understood herein that the use of the term high band may signify the extended frequency components as generated by the bandwidth extender 303.

In order to assist in the understanding of the invention the operation of the bandwidth extender 303 will hereafter be described in more detail with reference to the flow chart of FIG. 8.

In some embodiments the audio bandwidth extender 303 comprises a frame collector 403.

The input 401 in some embodiments is connected to the frame collector 403 whereby the input audio signal (otherwise known as the audio sample stream) is partitioned and collated into a continual series of audio frames.

In some embodiments the number of audio samples collated into a frame can be dependent upon the sampling frequency of the input audio signal.

For example, in some embodiments the sampling frequency of the input audio signal 304 can by 8 kHz. In such embodiments the frame collector 403 may be arranged to partition the input audio signal into a plurality of audio frames with each audio frame spanning a time period of 12 ms. In other words in such embodiments each audio frame comprises 96 audio samples at a sampling rate of 8 kHz.

Furthermore, the frame collector 403 can in some embodiments be arranged to have overlapping frames, whereby the rate at which the frame is updated is less than the length of the audio frame.

For example, in some embodiments the audio frame can be updated every 10 ms (80 samples) by the frame collector 403 such that there can be an overlap of 16 samples between frames.

It is to be understood that the frame collector 403 in some embodiments can operate at a plethora sampling frequencies and frame sizes, and that the operation of the bandwidth extender 303 is not limited to the example given by some embodiments.

The step of collating the input audio samples into an audio signal frame 404 by the frame collector 403 is shown as processing step 801 in FIG. 8.

In some embodiments the artificial bandwidth extender 303 comprises a time to frequency transformer 405.

The output from the frame collector 403 can in some embodiments be passed to the time to frequency transformer 405, whereby a time based audio signal frame 404 may be subjected to an orthogonal based transform on a frame by frame basis.

In some embodiments the orthogonal based transform can be implemented as a fast fourier transform (FFT), whereby the time based audio signal frame 404 of 96 samples can be transformed to the frequency domain with a 128 point FFT. In these embodiments the application of the 128 point FFT can be applied by padding the audio signal frame 404 with additional zero valued samples.

It is to be understood in some embodiments that the transformation of the audio signal frame 404 into frequency coefficients facilitates the extraction of frequency domain features.

It is to be further understood in some embodiments that the frequency coefficients generated for the audio signal frame 404 can be considered as a low band frequency domain audio signal.

The step of transforming the audio signal frame 404 into a frequency domain representation comprising frequency coefficients is shown as processing step 803 in FIG. 8.

In some embodiments the artificial bandwidth extender 303 comprises a feature extractor 407.

The frequency domain coefficients of the audio signal frame 404 can in these embodiments be conveyed to the input of the feature extractor 407.

In some embodiments, the feature extractor 407 may also be arranged to receive a further input from the frame collector 403. This further input may be used to convey the audio signal frame 404 directly from the frame collector 403 to the feature extractor 407, thereby circumventing the time to frequency transformer 405.

With reference to FIG. 4, the time domain audio signal frame 404 can in these embodiments be conveyed by the connection 440 between the frame collector 403 and the feature extractor 407.

The feature extractor 407 can in some embodiments be used to extract features from both the audio signal frame and the frequency domain transformation of the audio signal frame. The features extracted from the feature extractor 407 can in some embodiments be used to generate in part the extended frequency region of the audio signal frame.

It is to be understood herein that the extended frequency region of the audio signal frame can be referred to as a high band signal.

It is to be further understood herein that the frequency domain transformation of the audio signal frame can in some embodiments be referred to as a frequency domain signal.

In some embodiments a nine dimensional feature vector comprising both frequency domain and time domain features can be extracted for each frame of the input audio signal and frequency domain signal.

In some other embodiments a ten or other number dimensional feature vector comprising both frequency domain and time domain features can be extracted for each frame.

In some embodiments a first set of frequency domain feature components can be derived by dividing the frequency domain signal into a number of overlapping sub bands and then determining the energy of each sub band. Each sub band energy value can then in such embodiments form a frequency domain component of the feature vector.

In some embodiments the energy of each sub band can be determined by squaring the magnitude of each frequency domain coefficient lying within the sub band. In other words, the frequency domain features can in these embodiments be extracted at least in part by determining the power spectral density of the frequency coefficients of the input signal.

In some embodiments the frequency domain signal can be divided into a plurality of overlapping sub bands in which each sub band can have an equal bandwidth according to a psychoacoustically derived mel scale.

For example in some embodiments, in which the input audio signal to the bandwidth extender 303 has a sampling frequency of 8 kHz, the low band audio signal can have an effective frequency range from 250 to 3500 Hz. In these embodiments the frequency domain signal can be divided into five sub bands whereby each sub band has an equal bandwidth according to the to the psychacoustically derived mel scale.

In some embodiments the mapping of frequency components from Hz to the mel scale can be expressed as $$m = 2595 \log_{10}(1 + f/700),$$

where f is the frequency in Hz, and m is the mel scale mapping corresponding to the frequency component f.

In these embodiments each one of the equally divided (mel scale) overlapping sub bands can be filtered according to a triangular band pass filter. In other words a triangular shaped mask may be applied to the frequency domain components of each of the sub band in order to obtain the sub band energy.

The triangular shaped mask can have the advantage in some embodiments of modelling the auditory masking properties of frequencies within the same critical band of the human auditory system.

In other embodiments each one of the equally divided overlapping sub bands can be filtered with a trapezoidal band pass filter.

It is to be understood in some embodiments that the trapezoidal or triangular shaped masking filters can be derived such that the filter is wider than the critical band of the human auditory system.

It is to be understood in some embodiments that the filter can be applied to each sub band in turn in the frequency domain, which may have the advantage of modelling the frequency resolution of the human auditory system across the width of the input audio signal. This advantage may be seen in FIG. 5 which depicts in the frequency domain the application of triangular shaped filters to the components of the frequency domain signal.

Figure 5:
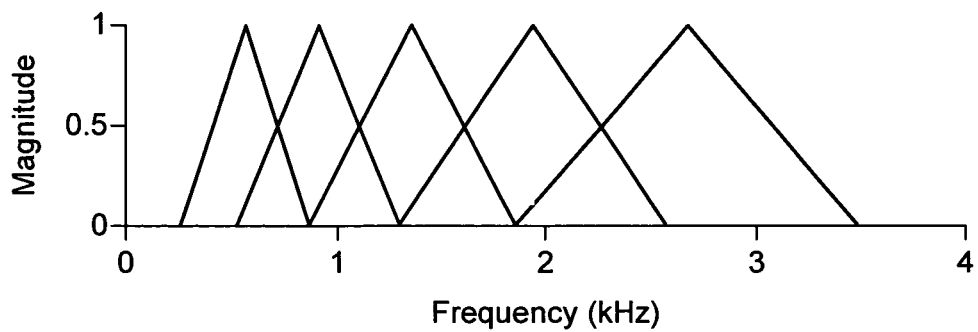
FIG. 5 shows advantages of applying critical bands and the property of auditory masking to the input audio signal of the bandwidth extender in order to facilitate feature extraction.

With reference to FIG. 5 it may be further seen that the auditory filters in the frequency domain can in some embodiments have a narrower bandwidth at the lower frequencies than auditory filters placed at the higher frequencies. Further, it may also be seen that the bandwidth of each subsequent auditory filter in some embodiments increases according to the mel scale.

It is to be understood in some embodiments that the power spectral density values for the input audio signal frame can be filtered using the sub band filters according to the mel scale. In other words the power spectral density values can be filtered using the series of auditory based sub band filters according to FIG. 5.

It is to be further understood in some embodiments that the above filtering step has the advantage of dividing power spectral density representation of the input audio signal frame into a number of sub bands which are uniformly spaced on the mel scale.

Once the input audio signal frame has been filtered into a number of sub bands, the energy for each sub band can in these embodiments be determined by calculating the sum of the filtered power spectral density values within the sub band.

Generally it is to be understood in some embodiments, that the sub band energy level value may be determined by initially calculating the frequency domain spectrum of the signal, from which the power spectrum can be determined by squaring the spectral magnitude values. Then for each sub band, the power spectral values constituting the particular sub band in question can be weighted (or shaped) using an auditory filter such as the triangular window mentioned above. The energy of each sub band is then given by the sum of the weighted power spectral components within the sub band.

In some embodiments there may be five sub band energy values, where each sub band energy value may correspond to one of the five sub bands. However it would be understood the more than or less than five sub band energy values could be determined in some other embodiments.

It is to be understood that the sub band energy values can provide a concise representation of the spectral shape and power level for the audio signal frame 404.

It is to be further understood in some of embodiments that the sub band energies corresponding to the first five sub bands can form the first five features of the feature vector extracted for each audio signal frame.

In some embodiments the sub band energies corresponding to the five sub bands may be converted according to the decibel scale.

The feature extractor 407 can in some embodiments also extract further frequency domain features from the frequency domain signal. These further frequency domain features can be based on the centroid, or otherwise known as the centre of gravity, of the spectrum of the frequency domain signal.

In some embodiments the centroid C of the spectrum of the frequency domain signal can be determined by using the squared magnitude of the frequency spectrum as calculated by the time to frequency transformer 405.

The centroid C for a frequency domain signal spectrum of N samples, according to some embodiments, may be determined as $$C = \left( \frac{\sum_{i=0}^{N/2} f(i) P(i)}{(N/2+1) \sum_{i=0}^{N/2} P(i)} \right)^2$$

where i is an index denoting a frequency component within the low band audio signal, P(i) denotes the square magnitude for a frequency component i, and f(i) denotes the frequency at index i.

It is to be understood in some embodiments the centroid of the frequency domain signal spectrum can form the sixth component of the extracted feature.

Some embodiments can derive a seventh frequency domain based feature by determining the spectral flatness of the input audio signal frame. This feature may be used to indicate the tonality of the input audio signal frame.

In these embodiments the spectral flatness of a signal can be derived by determining the ratio between the geometric mean and the arithmetic mean of the power spectrum of the signal.

The spectral flatness measure according to some embodiments may be expressed as $$x_{sf} = \log_{10} \frac{N_{sf} \sqrt{\sum_{i=N_1}^{N_h} P(i)}}{\frac{1}{N_{sf}} \sum_{i=N_1}^{N_h} P(i)},$$

where P(i) denotes the power spectrum value at a frequency index i, $N_l$ and $N_h$ denotes the indices of the first and last frequency components over which the spectral flatness measure is determined, and $N_{sf}$ denotes the number components within this range.

In some embodiments the spectral flatness measure can be determined over the frequency range from 300 Hz to 3.4 kHz.

As mentioned above the feature extractor 407 can in some embodiments also extract time domain based features from the audio signal frame 404 by processing the time domain signal conveyed on the connection 440.

In some embodiments a first time domain based feature extracted by the feature extractor 407 can be a gradient index based on the sum of magnitudes of the gradient of the speech signal in the time domain.

It is to be understood that the gradient in such embodiments can be determined at any point of the speech signal waveform. However, in these embodiments the gradient index can be determined for those points in the speech waveform which may result in a change in the sign of the gradient value. In other words, the gradient index can be based in some embodiments on the sum of the magnitude of the gradient at points in the speech waveform which result in a change in direction of the speech waveform.

In some embodiments the gradient index $x_{gi}$ may be determined as $$\frac{\sum_{n=1}^{N_T-1} \Delta\Psi(n)|s(n) - s(n-1)|}{\sqrt{\sum_{n=0}^{N-1} (s(n)^2)}},$$

where s(n) denotes a sample of speech at time instance n, and $N_T$ represents the number of speech samples in the audio signal frame 404. The term $\Delta\Psi(n)$ may be representative of the change in the sign of the gradient at time instance n and may be determined as $$\Delta\Psi(n) = \frac{1}{2}|\psi(n) - \psi(n-1)|,$$

where $\Psi(n)$ denotes the sign of the gradient s(n)−s(n−1) and may be determined as $$\psi(n) = \frac{s(n) - s(n-1)}{|s(n) - s(n-1)|}$$

It may be observed in some embodiments that the gradient index $x_{gi}$ can have low values during voiced sounds and high values during unvoiced sounds.

Some embodiments can also extract a second time based feature which may be dependent on the energy ratio of the audio signal frame.

In these embodiments the feature may be determined by calculating the ratio of the energy of the current audio signal frame 404 to the energy of a previous audio signal frame. The resultant value can in some embodiments then be scaled according to the decibel range.

It may be observed in some embodiments that the above feature can have the added advantage of differentiating the unvoiced stop constant sound from other unvoiced speech sounds.

Some embodiments can derive a third time based feature for the audio signal frame by determining whether the signal exhibits active or inactive regions.

In these embodiments the audio signal frame 404 can be processed by a voice activity detector (VAD) in order to classify the signal as either active or inactive.

In some embodiments the VAD may be implemented by initially transforming the time domain signal (otherwise known as the audio signal frame 404) into the frequency domain by the means of a suitable orthogonal transform such as the FFT. Once the input signal to the VAD has been transformed to the frequency domain it may be grouped into a plurality of sub bands. Typically in some embodiments this grouping can be performed to a non linear scale in which more frequency components are allocated to the perceptually more important lower sub bands. Signal to noise ratios (SNR) for each sub band can then be calculated by considering the energy of the signal and background noise within each sub band. The VAD decision can then be derived by comparing the sum of the SNR for each sub band against an adaptive threshold.

Typically in some embodiments the background noise energy for each sub band can be adapted during noisy input frames using an auto-regressive based scheme.

Some embodiments can deploy a plethora of techniques to prevent false VAD decisions. For instance, some embodiments can deploy a "hangover period" whereby a VAD decision from active to inactive is delayed in order to prevent a false decision when the signal is displaying unvoiced characteristics. Other techniques in some embodiments can include measuring the variance of the instantaneous frame to frame SNRs in order to increase the VAD decision threshold during highly fluctuating signals.

In some embodiments may deploy voice activity detection techniques such as specified by the $3^{rd}$ Generation Partnership Project (3GPP) standard Adaptive Multi Rate (AMR) Speech Codec 3GPP TS 26.090 can be used. It is to be understood in some embodiments that the three time based features as outlined above can constitute further features extracted by the feature extractor 407. In other words, the gradient index, energy ratio and binary VAD output can in some embodiments form three further components of the feature vector produced by the feature extractor 407.

It is to be further understood in some embodiments that the feature vector as determined by the feature extractor 407 can be determined on a frame by frame basis from the input audio signal 401.

The step of processing the audio signal frame 404 in both time and frequency domains in order to extract the feature vector may be shown as processing step 805 in FIG. 8.

In some embodiments the artificial bandwidth extender 303 comprises a neutral network processor 409.

The feature vector as determined by the feature extractor 407 in some embodiments is conveyed to the neural network processor 409.

The neural network processor 409 can in some embodiments be used to generate in part the spectral shape of the artificially generated high band signal 431.

In some embodiments the neural network processor 409 can comprise a neural network which may be trained with variable data to evolve the capability of the neural network in varying environments and conditions such as different noise types, noise levels or languages.

In some embodiments, a neuroevolution method based on genetic algorithms can be adopted to evolve the neural network. These evolved neural networks may be recurrent, in other words they can collect and use historical information about the evolution process and are not limited to the features of the input vector from the feature extractor 407.

In some embodiments a method of neuroevolution based on augmenting neural network topologies can be used. This method can typically start from a minimal network topology which may then be incrementally improved by adding additional nodes and network links in conjunction with modifying the weighting factors associated with the network nodes.

Typically, in some embodiments a neural network based on neuroevolution of augmenting topologies (NEAT) can be evolved with a perceptron like feed-forward network of only input neurons and output neurons. As the evolution progresses through discrete steps, the complexity of the network's topology can grow, either by inserting a new neuron into a connection path, or by creating a new connection between (formerly unconnected) neurons.

In some embodiments the NEAT neural network can be trained in an off line mode using a training database comprising a plurality of audio samples of a number of different speakers.

In some other embodiments the classification and pattern recognition identification operations can be performed by any suitable pattern recognition apparatus or algorithm, such as for example any suitable artificial neural network, a self organizing map or self organizing feature map, Baysean network etc.

Audio samples from the training base can in some embodiments be first high pass filtered in order to simulate the input frequency response of a mobile station. The filtering in some embodiments can be done according to the mobile station input filter (MSIN) as specified by the International Telecommunications Union (ITU) standard G.191.

Feature vectors for each of the audio samples within the training database can in some embodiment be extracted as described above for use in training the NEAT neural network.

Additionally, a set of target outputs for the neural network can in some embodiments be generated, in which each target output of the neural network corresponds to a particular audio sample within the training base. These target outputs can then be used to determine the performance of the neural network during its training phase. In other words, the output of the neural network for each audio sample of the training base can be compared to the corresponding target output in order to determine the performance of the neural network.

In some embodiments the target output for the neural network can be generated by determining the parameters associated with the spectral shape of the artificially generated high band signal for each corresponding audio sample of the training data base.

It is to be understood therefore that in order to train the above neural network it can be required to generate a target output for each audio training sample of the training database, in which each audio training sample may comprise a wideband audio signal.

The target output associated with each audio training sample in some embodiments can be generated by initially determining the high band component of each wideband audio training sample, and then generating the spectral shape parameters associated with each of the determined high band components.

It is to be appreciated that each set of spectral shape parameters can in some embodiments form a target output of the neural network, and that each target output can in these embodiments be associated with a specific audio training sample from the training database.

According to some embodiments the training process for the above neural network can take the following form: each wideband training signal can be divided into a number frames, of which the length of each frame can be determined by the operating frame length of the bandwidth extender 303; the high band component of each frame can then be determined; and for each high band component the spectral shape represented as the energy levels of each sub band (of the high band component) can then be calculated.

It is to be understood that it is the energy levels of each of the sub bands of the high band component that form the target values for the neural network estimator.

It is to be further appreciated that the high band signal as mentioned above is akin to an artificially generated high band signal 431. In other words the high band signal is a representation of the artificially generated high band signal 431, which is formed for the purpose of training the neural network in the neural network processor 409.

In some embodiments the shape of the artificially generated high band spectrum can be realised as a set of energy levels, where each energy level can correspond to one of a plurality of sub bands. In other words a set of spectral shape parameters of the artificially generated high band spectrum can in such embodiments be realised as the above set of energy levels.

In some embodiments the spectral shape of the artificially generated high band spectrum may be realised by the energy levels of four partially overlapping sub bands drawn from the psychoacoustically derived mel scale. In other words the frequency components of a wideband signal sampled at 16 kHz can be modelled as four sub bands located uniformly on a logarithmic scale over the frequency range from 4 kHz to 8 kHz.

The band pass filter associated with each sub band can be implemented in some embodiments in the frequency domain as a triangular window function, and the energy level of each sub band can then be determined by calculating the power spectrum of the frequency components residing within the sub band.

In some embodiments the energy for each sub band can be determined by summing the square of the magnitudes of the frequency components within the filtered sub band.

Figure 6:
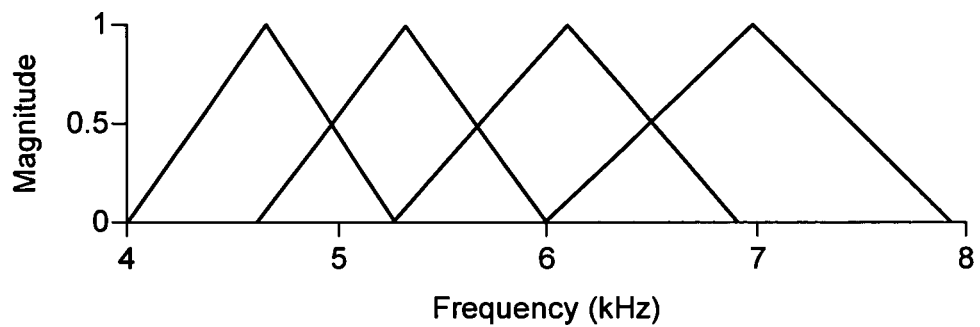
FIG. 6 shows advantages of applying critical bands in order to facilitate the generation of the artificially bandwidth extended signal.

The advantage of applying triangular window functions to the high band signal can be seen with reference to FIG. 6 which depicts the distribution of sub bands for the artificially generated high band signal 431 in the frequency domain.

Further, it may also be seen by reference to FIG. 6 that the base of each band pass filter, in other words the triangular window function, can extend approximately between the centre frequencies of two adjacent sub bands.

It is to be appreciated therefore that the above process for determining the energy levels for each overlapping sub band (otherwise known as the spectral shape parameters) can be performed for each training database sample in turn.

It is to be further appreciated that these overlapping sub band energy levels in some embodiments can form the target outputs for the neural network during the off line training phase. In other words each set of overlapping sub band energy levels associated with the high band of each wideband training database sample forms a target output for the NEAT neural network.

It is to be appreciated in some embodiments that when the NEAT neural network is running in an "on line" mode of operation, the evolved genomes of the neural network may then be used to process each feature vector from the feature extractor 407. This in turn may then be used by the neural network processor 409 to generate the spectral shape parameters for the artificial high band signal 431. In other words the feature vector as extracted from the (low band) audio signal frame can be used by the neural network processor 409 to generate a corresponding set of spectral shape parameters for the artificially generated high band signal 431.

The generation of the spectral shape parameters may be performed on an audio frame by audio frame basis.

It is to be further understood in some embodiments that the output from the NEAT neural network processor 409 when operating in an "on line" mode can constitute the four sub band energy levels corresponding to the four mel overlapping sub bands, as described above.

It is to be appreciated in some embodiments that the spectral shape parameters, in other words the sub band energy levels for each sub band, can be determined by using features extracted solely from the (low band) audio signal frame 404.

The step of determining the spectral shape parameters by the neural network processor 409 is shown as processing step 807 in FIG. 8.

In some embodiments the artificial bandwidth extender 303 comprises a band energy smoother 411. The output from the neural network processor 409 can then be connected to the input of the band energy smoother 411.

The band energy smoother 411 can in some embodiments filter the energy level for each sub band over current and past values. This may have the advantage of counteracting annoying artefacts which can be produced as a result of the neural network processor 409 selecting sub band energy levels which can in some embodiments be too high. In other words, the filtering of each sub band energy level may have the advantage of smoothing out any rapid changes.

In some embodiments the band energy smoother 411 can subject the energy level for each sub band to a first order auto regressive filter. In other words a weighted average value may be calculated for each sub band energy level using the current sub band energy level and a past filtered sub band energy level.

In some embodiments the auto regressive filter applied to each sub band energy level can be represented as $$E_f(n)=\phi E(n)+\gamma E_f(n-1)$$

where $E(n)$ and $E_f(n)$ represents the sub band energy level and filtered sub band energy level respectively at a frame instance n. Where $\phi$ denotes the weighting factor applied to the current sub band energy level $E(n)$, and $\gamma$ denotes the weighting factor applied to the previous filtered sub band energy level $E_f(n-1)$.

In some embodiments the above auto regressive filter can only be applied for those sub band energy levels which are greater than the previous filtered sub band energy level. In other words the filter can in such embodiments only be applied when $E(n)>E_f(n-1)$ It is to be understood that the above auto regressive filter can be applied to the energy level for each sub band in turn in these embodiments.

It is to be further understood that the above filtering process can be performed on a per frame n basis.

In the first group of embodiments the values of $\phi$ and $\gamma$ can be determined to be 0.25 and 0.75 respectively.

It is to be appreciated in some other embodiments that the values of $\phi$ and $\gamma$ can be limited not only to the above values as above. For instance, some other embodiments can deploy other values of $\phi$ and $\gamma$, such that the values selected hold true for the expression $\phi+\gamma=1$.

In some embodiments the band energy smoother 411 can incorporate an additional processing step whereby the high band signal can be attenuated when the power of the input audio signal 404 (in other words the low band signal or telephone band signal) is close to an adaptive noise level estimate.

In order to effectuate this additional processing step the energy of the input audio signal 404 can be calculated for each frame. In some embodiments this calculation can be performed as part of the functionality for the frame collector 403.

A noise floor estimate of the input audio signal can in some embodiments determine by filtering the energy contour over an input audio signal frame by frame basis. The filtering can be performed for example by using a first order recursive filter.

In some embodiments the first order recursive filter can have coefficients which change according to the change in direction of the energy contour. For example, in some embodiments when there is an upward change in energy contour direction the first order recursive filter can adopt a particular coefficient which may have a different value to the filter coefficient used when there is a downward change in energy contour direction.

The value of the filter coefficients can in some embodiments be chosen such that the noise level estimate gradually rises during regions of speech, and decays rapidly towards a minimum when there is a pause in the audio signal 404.

The sub band energy levels associated with the current frame of the artificially generated high band signal 431 can in some embodiments be attenuated according to the difference between the energy of the current audio signal frame and the noise floor estimate using piecewise linear mapping.

The above described adaptive attenuation technique can in such embodiments have the advantage of reducing perceived noise in the artificially generated high band signal 431.

The step of filtering the energy levels associated with each sub band of the artificially generated high band signal 431 is shown as processing step 809 in FIG. 8.

In some embodiments the artificial bandwidth extender 303 comprises an excitation signal generator 417, an up-sampler 419, a filter bank 421 and a band weighting and summing processor 415.

The artificially generated high band signal 431 can in such embodiments be produced at least in part by inputting the time domain frames into an excitation signal generator 417 up-sampling the output of the excitation signal generator 417 in the up-sampler 419 filtering an up-sampled excitation signal through the filter bank 421 and then weighting each sub band signal with a gain factor derived from the corresponding mel band energy levels. In other words each sub band from the filter bank 421 can in some embodiments be individually weighted by a corresponding sub band gain factor. The gain factor can in some embodiments be derived from the sub band energy level associated with the particular sub band in question and also sub band energy levels associated with neighbouring sub bands. The artificially generated high band signal 431 can in such embodiments then be constructed by summing the weighted sub band signals together in the band weighting and summing processor 415.

In some embodiments the sub band gain factor for each sub band of the filter bank 421 can be determined by the energy to gain converter 413, whereby an energy level associated with a particular sub band of the filter bank can in such embodiments be converted to a suitable gain factor.

It is to be appreciated for some embodiments that the bandwidth over which the neural network processor 409 determines each energy level can be commensurate with the bandwidth of each sub band of the subsequent filter bank. In other words the subsequent filter bank can also use the same partially overlapping sub bands as that used by the neural network processor 409 to determine the high band energy levels.

In some embodiments the filter bank can have four sub bands which may be equivalent to the four sub bands used to obtain the high band energy levels. However fewer or greater than four sub-bands can be used to obtain the high band energy levels in some other embodiments.

Figure 7:
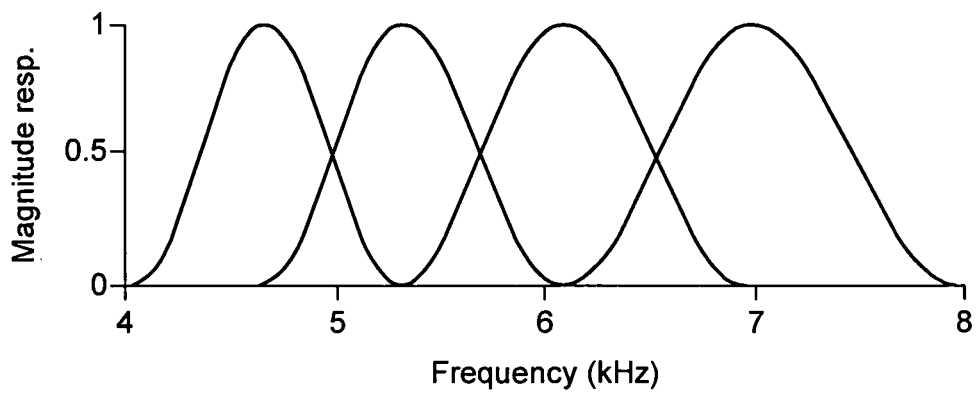
FIG. 7 shows advantages of deploying a filter bank in which the sub bands are determined by critical bands.

An example of the frequency distribution of each sub band of the filter bank 421 deployed in the first group of embodiments is depicted in FIG. 7.

It may be seen by comparing the sub band frequency distribution in FIG. 7 with the sub band distribution in FIG. 6 that the bandwidth and frequency distributions of the four sub bands of the filter bank are equivalent to the four sub bands used to obtain the high band energy levels in the neural network processor 409. In other words the centre frequencies and frequency ranges of each sub band are equivalent in both sets filter banks.

With reference to FIG. 4 it may be seen that an input to the energy to gain converter 413 can in some embodiments be connected to an output of the band energy smoother 411. In such configurations the energy level associated with each sub band may be conveyed from the band energy smoother 411 to the energy to gain converter 413.

As mentioned above the energy to gain converter 413 can be used in some embodiments to determine sub band gain factors for each sub band of the filter bank.

In order to assist in the understanding of the operation of some embodiments the sub band energy level E will be written hereinafter as a function with respect to the sub band index k.

In some embodiments an iterative based technique can be adopted for determining a sub band gain factor g(k) for each sub band k of the filter bank 421.

In order to assist in the understanding of the invention the step of determining the sub band gain factor for each sub band of the filter bank 421 will hereafter be described with reference to the flow chart of FIG. 9.

The step of inputting the sub band energy level from the output of the band energy smoother 411 is shown as processing step 901 in FIG. 9.

It is to be understood that in some embodiments the psychoacoustically derived window function can be the triangular based window function according to the mel scale as described above.

It is to be further understood that the psychoacoustically derived sub band structure for the artificially generated high band signal 431 can in these embodiments comprise a plurality of overlapping sub bands whereby the energy from one sub band may contribute to the energy of each of its neighbouring sub bands. An example of the effect of overlapping sub bands may be seen in FIG. 7, where it can be seen that the energy of the second sub band one contributes to the energy of both the neighbouring first and third sub bands.

In a first example an initial gain factor $g_0(k)$ can be determined for each sub band by estimating a gain value that would give the sub band energy E for the sub band k without taking the neighbouring sub bands into account.

In some embodiments this initial gain factor $g_0(k)$ for a sub band k may be estimated as $$g_0(k) = \sqrt{\frac{E(k)}{c_k}},$$

where E(k) is the sub band energy level for the sub band k and $c_k$ where is a precomputed constant that represents the energy of the $k^{th}$ synthesis band.

The step of determining the initial gain factor $g_0(k)$ for a sub band k is shown as processing step 903 in FIG. 9.

Once the initial gain value $g_0(k)$ has been determined for a particular sub band, a new estimate of the gain factor $g_1(k)$ may be calculated based on weighting the initial gain factor for the particular sub band k. The new estimate of the gain factor $g_1(k)$ for the sub band k can be considered in some embodiments to be a first iteration of the determination algorithm for the sub band gain factor g(k). The weighting of the initial gain factor can in these embodiments be performed by considering the ratio of the energy value E(k) for the sub band k (otherwise referred to the sub band energy level E for the sub band k) to energy level value for the sub band k which takes the spreading into adjacent bands into account. For the first iteration of the sub band gain factor determination process the energy level value for the sub band k can be denoted as $E_0(k)$. The weighting factor in such embodiments can then be obtained by taking the square root of the energy ratio.

It is to be understood that the energy value E(k) for the sub band k can in some embodiments be the sub band energy value as determined by the output of the band energy smoother 411 during processing step 809.

The step of determining the weighting factor is shown as processing steps 905 and 907 in FIG. 9.

According to some embodiments the new estimate of the gain factor for a first iteration for a sub band k may be expressed as $$g_1(k) = g_0(k)\sqrt{\frac{E(k)}{E_0(k)}}.$$

In the general case an iteration i of the algorithm may yield a gain factor for the sub band k of $$g_i(k) = g_{i-1}(k)\sqrt{\frac{E(k)}{E_{i-1}(k)}},$$

where $g_i(k)$ denotes the sub band gain factor corresponding to the $i^{th}$ iteration, $g_{i-1}(k)$ denotes the value of the sub band gain factor corresponding to the previous i−1 iteration, and $E_{1-1}(k)$ corresponds to the energy level value of the sub band k. In some embodiments the value of $E_{i-1}(k)$ can be determined as the weighted sum of squared gain factors $g_{i-1}(k)$ and the products of adjacent gain factors from the neighbouring sub bands, i.e. $g_{i-1}(k-1)*g_{i-1}(k)$ and $g_{i-1}(k)*g_{i-1}(k+1)$.

These embodiments have the advantage of taking into account the energy from neighbouring sub bands when determining the value of $E_{i-1}(k)$.

In some embodiments the above calculation of $E_{i-1}(k)$ can further comprise weighting the square of the gain factors and the product of adjacent gain factors by weighting coefficients. The weighting coefficients can be determined such that: the frequencies above the centre point of the highest sub band filter of the filter bank 421 are at a unit gain; and the frequencies below the centre point of the lowest sub band filter of the filter bank 421 are also at a unit gain.

The step of weighting the gain factor from the previous iteration to produce a new value for the gain factor is shown as processing step 909 in FIG. 9.

The gain factor determination algorithm can be executed for a number of iterations until a terminating condition has been reached.

The step of determining if a terminating condition has been reached is shown as processing step 911 in FIG. 9, and the step of repeating the process for a further iteration should the terminating condition not been reached is shown as processing step 913 in FIG. 9.

For example, in some embodiments it has been determined that two iterations of the algorithm are found to be sufficient in order to estimate the sub band gain factor. This value has been determined experimentally to produce an advantageous result.

The step of determining that the current iteration of gain factor yields the gain factor for a particular sub band is shown as processing step 915 in FIG. 9.

It is to be understood in some embodiments that the above gain factor determination process can be repeated for each overlapping sub band for the artificially generated high band signal.

For example, in some embodiments the above gain factor determination process can be performed for each sub band simultaneously in order to account for the effect of neighbouring sub bands.

It is to be further understood in some embodiments that the above sub band gain factor determination process can be performed on a per audio frame basis.

The step of determining the sub band gain factor for each sub band of the filter bank 421 is shown as processing step 811 in FIG. 8.

The sub band gain factors can then be passed to the band weighting and summing processor 415 via a connection from the energy to gain converter 413.

As stated previously the artificially generated high band signal can be generated by passing a signal into a filter bank 421, and then weighting each output sub band signal according to a corresponding sub band gain factor.

It is to be appreciated in some embodiments that the process of filtering the excitation signal with a filter bank and then weighting each subsequent sub band signal with a corresponding sub band gain factor can be viewed as providing a high band spectral shape of the artificially generated high band signal 431.

The excitation signal can in some embodiments be generated from the input (narrow band) audio signal into the artificial bandwidth extender 303, in other words the signal 401.

In order to facilitate the generation of the excitation signal for the filter bank the output of the frame collector 403 can in some embodiments be additionally connected to the excitation signal generator 417. Linear predictive (LP) analysis filtering can in such embodiments then be performed on the input audio signal frame 404 in order to produce an excitation signal with an essentially flat spectrum.

In some embodiments the linear prediction analysis filtering can be performed on a per frame basis whereby the coefficients of a LP analysis filter can be calculated for each audio signal frame 404.

In order to assist in the understanding of the excitation signal generation process the functionality of the excitation signal generator 414 will be described hereafter with reference to the flow chart of FIG. 10.

In order to determine the filter coefficients for the LP analysis filter, the excitation signal generator 417 can in some embodiments analyse the short term correlations in the audio signal frame 404 as provided by the frame collector 403.

In some embodiments of the invention the analysis of the short term correlations of the audio frame can be accomplished by linear predictive coding (LPC) analysis. This technique relies on either calculating the autocovariance or autocorrelation of the input audio frame over a range of different sample delays, whereby the range of sample delays can be determined by the filter order.

In some embodiments the LPC analysis can be performed using the autocorrelation method whereby the result of calculating the autocorrelations over the range of different delays (as determined by the filter order) can be formed into a symmetrical square matrix known as a Toeplitz matrix. The Toeplitz matrix has the property that it is symmetrical about the main diagonal and all the elements along any given diagonal are equal. In order to determine the LPC filter coefficients the matrix can in some embodiments be inverted using the Levinson-Durbin algorithm.

In some other embodiments the LPC analysis may be performed using the autocovariance method.

In the autocovariance method the covariance over the range of different delays of samples within the audio frame can be determined in order to form a covariance matrix. The size of the matrix is determined by the range of delays over which the various values of covariance are calculated.

As above, it is to be appreciated that the range of delays over which the values of the covariance may be calculated are determined by the number of LPC coefficients and hence the order of the subsequent LP analysis filter.

In some embodiments the covariance matrix is symmetrical about the leading diagonal. However, unlike the Toeplitz matrix the values within a given diagonal are not necessary equal. In these embodiments the matrix can be inverted using the Cholesky Decomposition in order to derive the LPC filter coefficients.

It is to be appreciated in these embodiments that the covariance method does not require that the audio signal frame is scaled with a suitable windowing function before LPC analysis. Consequently in such embodiments the windowing functionality within the frame collector 403 may not be performed.

The step of determining the LPC coefficients of the input audio signal frame 404 is shown in processing step 1001 in FIG. 10.

Once the LPC filter coefficients have been determined within the excitation signal generator 417, the input audio signal frame 404 can in some embodiments be filtered by the LP analysis filter in order to produce a LP residual signal.

In some embodiments the form of the LP analysis filter can be represented by the following expression $$A(z) = 1 + \sum_{i=1}^{M} a_i z^{-i},$$

where a represents the LPC filter coefficient, z is the unit sample delay and M is the LPC filter order.

In some embodiments the LPC order M can be determined to be ten. This value has been determined experimentally to produce an advantageous result.

The step of filtering the audio signal frame 404 by an LPC analysis filter is shown as the processing step 1003 in FIG. 10.

The LP residual signal can be further filtered through an autoregressive moving average (ARMA) filter formed from the LPC filter coefficients calculated for the current audio signal frame.

It is to be further appreciated that LP analysis filtering can in some embodiments have the effect of amplifying the spectral valleys in the signal to such an extent that the resulting overall spectral shape may be predominantly flat. However, spectral valleys can be typically associated with regions of low signal to noise ratio in the decoded audio signal. Consequently in some embodiments LP analysis filtering can have the detrimental effect of amplifying the noise in the LP residual signal.

In order to counteract some of the above effects, an ARMA filter can in some embodiments be applied to the LP residual signal. The application of the ARMA filter has the advantage in some embodiments of slightly amplifying the formants whilst slightly attenuating the spectral valleys. This can have the further advantage of diminishing the level of noise in the LP residual signal.

The form of the ARMA filter can in some embodiments be similar to the postfilter as found in many speech codecs such as the AMR codec specified by the 3$^{rd}$ Generation Partnership Project technical specification 3GPP TS 26.090.

The form of the ARMA filter can be represented by the following expression $$H_{ff}(z) = \frac{A(z/\beta)}{A(z/\alpha)} = \frac{1 + \sum_{i=1}^{M} a_i \beta^i z^{-i}}{1 + \sum_{i=1}^{M} a_i \alpha^i z^{-i}},$$

where the factors $\alpha$ and $\beta$ can be considered to be weighting factors whose values may lie within the range $0<\beta<\alpha<1$. The factor $\alpha$ has the effect of pulling the poles of the above ARMA filter towards to the centre of the unit circle, and similarly the factor $\beta$ has the effect of pulling the corresponding zeroes towards the centre of the unit circle.

In some embodiments the weighting factors $\alpha$ and $\beta$ can be determined to be 0.9 and 0.5 respectively. These values have been determined experimentally to produce an advantageous result.

It is to be appreciated that further embodiments can deploy ARMA filters whose weighting factors can be different to that of the first group of embodiments.

The step of post filtering the residual signal produced by the LPC analysis filter is shown as processing step 1005 in FIG. 10.

In the embodiments which deploy the above described ARMA filter for improving the quality of the LP residual a further processing step of applying a spectral tilt filter can be applied.

It is to be appreciated in these embodiments that an effect of using the above ARMA filter may result in a spectral tilt of the frequencies of the filtered LP residual signal. In order to counteract this effect a spectral tilt filter can in some embodiments be applied to the ARMA filtered LP residual signal which may in turn accentuate the attenuated frequencies in order to return the resulting LP residual signal to a predominately flat spectrum.

In some embodiments the above spectral tilt filter can have the form of a first order pole zero filter which may be determined by the following expression $$H_t(z) = \frac{1 - \mu z^{-1}}{1 + \mu z^{-1}},$$

where the coefficient, $\mu$ is proportional to the first reflection coefficient of the above ARMA filter $H_{ff}$ and can be determined as $$\mu = k_t \frac{R(1)}{R(0)},$$

where $R(0)$ and $R(1)$ are the zeroth and first autocorrelation coefficients, respectively, of the truncated impulse response for the ARMA filter $H_{ff}$, and $k_t$ is a constant which controls the amount of spectral tilt in the filter.

In some embodiments $k_t$ can be determined to be 0.6. This value has been determined experimentally to produce an advantageous result.

The step of applying a spectral tilt to the output of the ARMA postfiltering stage is shown as processing step 1007 in FIG. 10.

In some embodiments a further processing step can be applied whereby harmonics in the LP residual signal can be attenuated. This further processing step can be particularly advantageous for operating instances in which the input low band signal may exhibit strong harmonic characteristics. For example, some female speakers may exhibit particularly strong voiced regions which manifest into an unnatural metallic ringing noise in the extended signal.

In order to counteract this effect a further harmonic filter can in some embodiments be applied to the LP residual signal of the form $$H_{pf}(z) = 1 - k_{pf} g z^{-M},$$

where M is the pitch period (or lag) of the LP residual signal, and g is the corresponding optimal pitch gain. The factor $k_{pf}$ can be used in some embodiments to control the amount of attenuation that is applied over each pitch period. In other words the factor $k_{pf}$ can be used to control the harmonics in the LP residual signal.

In some embodiments the factor $k_{pf}$ can be determined to be 0.65. This value has been determined experimentally to produce an advantageous result.

In some embodiments the pitch period (or lag) M and corresponding optimal pitch gain g can be determined by using an open loop pitch lag estimation approach, in which correlations of the audio signal frame can be calculated over a number of different pitch delays. The pitch period M and corresponding optimal pitch gain g can in such embodiments then be determined to be the pitch lag and pitch gain which maximises the correlations of the audio signal frame.

In some other embodiments the pitch period and optimal pitch lag can be determined by maximising the correlations of the LP residual signal rather than the input audio signal frame.

An example of a suitable pitch determination algorithm which can be used as part of the process of harmonic filtering may be found in the AMR codec as specified by the 3$^{rd}$ Generation Partnership Project technical specification 3GPP TS 26.090.

It is to be appreciated that the above harmonic filter structure can be considered to be a type of comb filter.

The operation of harmonic filtering the LPC residual signal is shown as the processing step 1009 in FIG. 10.

It is to be further appreciated that the output from the comb filter can in some embodiments form the excitation signal.

The operation of generating the excitation signal by using the excitation signal generator 417 is shown as processing step 813 in FIG. 8.

The output excitation signal from the excitation signal generator 417 in some embodiments can be connected to the input of an up sampler 419.

In some embodiments the up sampler 419 can up sample the input LP residual signal by a specified factor.

In these embodiments the up sampling can be implemented by inserting zero valued samples between each sample of the LP residual signal. Overlap and add may be used to create a continuous time domain signal.

It is to be understood that low pass filtering may not used in the above up sampler 419 in order to allow aliases of the spectrum of the LP residual signal. This has the advantage of producing a signal which is extended across the whole band.

In some embodiments the LP residual signal can be up sampled by a factor of two. In other words the LP residual signal can be up sampled from 8 kHz to 16 kHz by inserting a zero valued sample between each sample value.

The operation of up sampling the filter bank excitation signal is shown as processing step 815 in FIG. 8.

The up sampled LP residual signal can then in some embodiments form the up-sampled excitation signal to the filter bank 421.

As mentioned above the filter bank 421 can in some embodiments have frequency characteristics similar to those used to determine the sub band energy levels from the neural network processor 409. In other words the filter bank 421 can in such embodiments be realised as a plurality of overlapping sub bands adhering to the same psychoacoustically derived mel scale as that used for the determination of the sub band energy levels for the spectrum of the artificially generated high band signal 431.

It is to be appreciated therefore that the distribution of sub bands within the filter bank 421 can in some embodiments approximately correspond to the critical bands of the human hearing system.

In some embodiments each sub band of the filter bank can be individually realised by using a linear phase frequency impulse response (FIR) filter.

In some embodiments the filter bank 412 can comprise four sub bands, with each sub band being realised as a 128 tap FIR filter.

Each sub band signal can be formed in some embodiments by filtering the excitation signal with the appropriate FIR filter.

With reference to FIG. 7, the distribution of sub bands within the filter bank 421 according to a first group of embodiments is shown.

The operation of generating the plurality of sub band signals by subjecting the input to the filter bank 421 to the excitation signal is shown as processing step 817 in FIG. 8.

The output sub band signals from the filter bank 421 can then be passed to the input of the band weighting and summing processor 415.

The band weighting and summing processor 415 can in some embodiments then individually weight each sub band signal with its corresponding sub band gain factor.

As mentioned above the sub band gain factors can be determined for each sub band by the energy to gain converter 413. The sub band gain factors can be passed from the energy to gain converter 413 via a further input to the weighting and summing processor 415.

Once each sub band signal has been individually weighted by its corresponding sub band gain factor, the weighted sub band signals can in some embodiments be summed together to form the artificially generated high band signal 431.

The operation of weighting each sub band signal with a corresponding weighting factor is shown as processing step 823 in FIG. 8.

In some embodiments there can be a gradual change in sub band gain factors between consecutive frames for each sub band. In other words the sub band gain factor for a particular sub band can be derived by interpolating between the sub band gain factor for a current frame and a following frame.

The interpolation of sub band gain factors over successive frames can be implemented in some embodiments by using a sinusoidal ramping function.

It is to be understood in some embodiments that the sampling frequency of the artificially generated high band signal 431 is related to the equivalent Nyquist bandwidth of the extended audio signal 435.

For example, if the artificially generated high band signal 431 is determined to have a Nyquist bandwidth which is equivalent to the Nyquist bandwidth of the input audio signal 401, then the sampling frequency of the artificially generated high band signal 431 can be double the sampling frequency of the input audio signal 401. In other words the sampling frequency of the artificially generated high band signal 431 can be double the input audio signal 401 in order to accommodate the additional frequency components generated by the artificial bandwidth extension process.

It is to be further understood that the overall sampling frequency of the artificial bandwidth extended audio signal 435 can in some embodiments also have the same sampling frequency as the artificially generated high band signal 431.

In some embodiments the Nyquist bandwidth of the input audio signal frame 404 can be 4 kHz. The artificial bandwidth extension process can in such embodiments then create an artificially generated high band signal spanning a frequency range from 4 kHz to 8 kHz at a sampling frequency of 16 kHz.

The artificially generated high band signal 431 in some embodiments then be passed to an input of a summer 427 in which the signal 431 is combined with an up sampled input audio signal 433 to produce the bandwidth extended signal 435.

It is to be understood in some embodiments that the sampling frequency of the input audio signal 433 can be the same as the sampling frequency of the artificial generated high band signal 431.

In order to facilitate the up sampling of the audio signal, the input audio signal 401 can be additionally connected to an input of a further up sampler 423 in some embodiments. The further up sampler 423 can in such embodiments up sample the input audio signal 401 by the same factor as the up sampler 419 deployed on the residual signal path.

It is to be appreciated that the further up sampler 423 can be deployed by effectively inserting zeroes between each sample of the input audio signal 401, and then low pass filtering the resulting signal in order to remove unwanted image components.

In some embodiments the further up sampler 423 can up sample the input audio signal 401 by a factor of two. In these embodiments the sampling frequency of the input audio signal 401 can be up sampled form 8 kHz to 16 kHz.

The operation of up sampling the input audio signal 401 such that it may be the same as the sampling frequency of the artificially generated high band signal 431 is shown as processing step 819 in FIG. 8.

The output of the up sampler 423 can in some embodiments be connected to the input of a signal delay device 425. The signal delay device 425 can in such embodiments be configured to perform a sample delay in time on the up sampled input audio signal.

In some embodiments the signal delay device 425 can delay the up sampled input audio signal 401 such that it is time aligned with the artificially generated high band signal 431.

The operation of delaying the up sampled input audio signal is shown as processing step 821 in FIG. 8.

The delayed up sampled input audio signal in such embodiments forms the input signal 433 to the summer 427 where the input audio signal is combined with the artificially generated high band signal 431 to form the bandwidth extended signal 435 as described above.

The operation of forming the bandwidth extended signal 435 is shown as processing step 825 in FIG. 8.

The bandwidth extended signal 435 may then be connected to the output 306 of the bandwidth extender 303.

Therefore in summary at least one embodiment of the invention comprises a method comprising: generating an excitation signal from an audio signal, wherein in the audio signal comprises a plurality of frequency components; extracting a feature vector from the audio signal, wherein the feature vector comprises at least one frequency domain component feature and at least one time domain component feature; determining at least one spectral shape parameter from the feature vector, wherein the at least one spectral shape parameter corresponds to a sub band signal comprising frequency components which belong to a further plurality of frequency components; and generating the sub band signal by filtering the excitation signal through a filter bank and weighting the filtered excitation signal with the at least one spectral shape parameter.

Although the above examples describe embodiments of the invention operating within a codec within an electronic device 10 or apparatus, it would be appreciated that the invention as described below may be implemented as part of any audio decoding process. Thus, for example, embodiments of the invention may be implemented in an audio decoder which may implement audio decoding from fixed or wired communication paths.

Thus user equipment may comprise a bandwidth extender such as those described in embodiments of the invention above.

It shall be appreciated that the term user equipment is intended to cover any suitable type of wireless user equipment, such as mobile telephones, portable data processing devices or portable web browsers.

Furthermore elements of a public land mobile network (PLMN) may also comprise audio codecs as described above.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions.

Therefore in summary at least one embodiment of the invention comprises an apparatus configured to: generate an excitation signal from an audio signal, wherein in the audio signal comprises a plurality of frequency components; extract a feature vector from the audio signal, wherein the feature vector comprises at least one frequency domain component feature and at least one time domain component feature; determine at least one spectral shape parameter from the feature vector, wherein the at least one spectral shape parameter corresponds to a sub band signal comprising frequency components which belong to a further plurality of frequency components; and generate the sub band signal by filtering the excitation signal through a filter bank and weighting the filtered excitation signal with the at least one spectral shape parameter.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs) and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A method comprising:
   generating an excitation signal from an audio signal, wherein in the audio signal comprises a plurality of frequency components;
   extracting a feature vector from the audio signal, wherein the feature vector comprises at least one frequency domain component feature and at least one time domain component feature;
   determining at least one spectral shape parameter from the feature vector, wherein the at least one spectral shape parameter corresponds to a sub band signal comprising frequency components which belong to a further plurality of frequency components; and
   generating the sub band signal by filtering the excitation signal through a filter bank and weighting the filtered excitation signal with the at least one spectral shape parameter,
   wherein the spectral shape parameter is a sub band energy level value and the sub band energy level value is attenuated when the power of the audio signal approaches an estimate of the level of noise in the audio signal.

2. The method as claimed in claim 1, wherein generating the excitation signal comprises:
   generating a residual signal by filtering the audio signal with an inverse linear predictive filter;
   filtering the residual signal with a post filter stage comprising an auto regressive moving average filter based on the linear predictive filter; and
   generating the excitation signal by up sampling and spectrally folding the output from the post filter stage.

3. The method as claimed in claim 2, wherein the post filter stage further comprises a spectral tilt filter and a harmonic filter.

4. The method as claimed in claim 1, wherein the frequency components of the sub band signal are distributed according to a psychoacoustic scale comprising a plurality of overlapping bands, and frequency characteristics of the filter bank correspond to a distribution of frequency components of the sub band signal.

5. The method as claimed in claim 4, wherein the overlapping bands are distributed according to the mel scale, and wherein the sub band signal is masked using at least one of:
   a triangular masking function; and
   a trapezoidal masking function.

6. The method as claimed in claim 1, wherein determining at least one spectral shape parameter from the feature vector comprises:
   using a neural network to determine the at least one spectral shape from the feature vector, wherein the feature vector extracted from the audio signal forms an input target vector to the neural network, and wherein the neural network is trained to provide a sub band spectral shape parameter for the input target vector.

7. The method as claimed in claim 1, wherein the at least one frequency domain component feature of the feature vector comprises at least one of the following:
   a group of a plurality of energy levels of the audio signal, wherein each of the plurality energy levels corresponds to the energy of an overlapping band of the audio signal;
   a value representing a centroid of the frequency domain spectrum of the audio signal; and
   a value representing the degree of flatness of the frequency domain spectrum.

8. The method as claimed in claim 1, wherein the at least one time domain component feature of the feature vector comprises at least one of the following:
   a gradient index based on the sum of the gradient at points in the audio signal which result in a change in direction of the waveform of the audio signal;
   a ratio of the energy of a frame of the audio signal to the energy of a previous frame of the audio signal; and
   a voice activity detector indicating whether a frame of the audio signal is classified as active or inactive.

9. The method as claimed in any of claim 1, further comprising combining the sub band signal with the audio signal to provide a bandwidth extended audio signal.

10. An apparatus comprising at least one processor and at least one memory including computer code, the at least one memory and the computer code configured to with the at least one processor cause the apparatus to at least:
    generate an excitation signal from an audio signal, wherein in the audio signal comprises a plurality of frequency components;
    extract a feature vector from the audio signal, wherein the feature vector comprises at least one frequency domain component feature and at least one time domain component feature;
    determine at least one spectral shape parameter from the feature vector, wherein the at least one spectral shape parameter corresponds to a sub band signal comprising frequency components which belong to a further plurality of frequency components; and
    generate the sub band signal by filtering the excitation signal through a filter bank and weighting the filtered excitation signal with the at least one spectral shape parameter,
    wherein the spectral shape parameter is a sub band energy level value and the sub band energy level value is attenuated when the power of the audio signal approaches an estimate of the level of noise in the audio signal.

11. The apparatus as claimed in claim 10, wherein the at least one memory and the computer code configured to with the at least one processor to cause the apparatus to at least perform generating the excitation signal is further configured to:
    generate a residual signal by filtering the audio signal with an inverse linear predictive filter;
    filter the residual signal with a post filter stage comprising an auto regressive moving average filter based on the linear predictive filter; and
    generate the excitation signal by up sampling and spectrally folding the output from the post filter stage.

12. The apparatus as claimed in claim 11, wherein the post filter stage further comprises a spectral tilt filter and a harmonic filter.

13. The apparatus as claimed in claim 10, wherein the frequency components of the sub band signal are distributed according to a psychoacoustic scale comprising a plurality of overlapping bands, and frequency characteristics of the filter bank correspond to a distribution of frequency components of the sub band signal.

14. The apparatus as claimed in claim 13, wherein the overlapping bands are distributed according to the mel scale, and wherein the sub band signal is masked using at least one of a triangular masking function; and a trapezoidal masking function.

15. The apparatus as claimed in claim 10, wherein the at least one memory and the computer code configured to with the at least one processor to cause the apparatus to at least perform determining at least one spectral shape parameter from the feature vector is further configured to:
    use a neural network to determine the at least one spectral shape from the feature vector, wherein the feature vector extracted from the audio signal forms an input target vector to the neural network, and wherein the neural network is trained to provide a sub band spectral shape parameter for the input target vector.

16. The apparatus as claimed in claim 10, wherein the at least one frequency domain component feature of the feature vector comprises at least one of the following:
   a group of a plurality of energy levels of the audio signal, wherein each of the plurality energy levels corresponds to the energy of an overlapping band of the audio signal;
   a value representing a centroid of the frequency domain spectrum of the audio signal; and
   a value representing the degree of flatness of the frequency domain spectrum.

17. The apparatus as claimed in claim 10, wherein the at least one time domain component feature of the feature vector comprises at least one of the following:
   a gradient index based on the sum of the gradient at points in the audio signal which result in a change in direction of the waveform of the audio signal;
   a ratio of the energy of a frame of the audio signal to the energy of a previous frame of the audio signal; and
   a voice activity detector indicating whether a frame of the audio signal is classified as active or inactive.

18. The apparatus as claimed in claim 10, wherein the at least one memory and the computer code is configured to:
   combine the sub band signal with the audio signal to provide a bandwidth extended audio signal.

* * * * *